United States Patent
Ando et al.

(10) Patent No.: US 12,225,835 B2
(45) Date of Patent: Feb. 11, 2025

(54) RESISTIVE SWITCHING DEVICE HAVING A PROTECTIVE ELECTRODE RING

(71) Applicant: International Business Machines Corporation, Armonk, NY (US)

(72) Inventors: Takashi Ando, Eastchester, NY (US); Ruilong Xie, Niskayuna, NY (US); Alexander Reznicek, Troy, NY (US); Pouya Hashemi, Purchase, NY (US)

(73) Assignee: International Business Machines Corporation, Armonk, NY (US)

( * ) Notice: Subject to any disclaimer, the term of this patent is extended or adjusted under 35 U.S.C. 154(b) by 687 days.

(21) Appl. No.: 17/483,868

(22) Filed: Sep. 24, 2021

(65) Prior Publication Data
US 2023/0109660 A1     Apr. 6, 2023

(51) Int. Cl.
*H10N 70/00* (2023.01)
*H10B 63/00* (2023.01)

(52) U.S. Cl.
CPC ......... *H10N 70/841* (2023.02); *H10N 70/063* (2023.02); *H10B 63/80* (2023.02); *H10N 70/826* (2023.02)

(58) Field of Classification Search
CPC ................. H01B 63/00; H10N 70/00
See application file for complete search history.

(56) References Cited

U.S. PATENT DOCUMENTS

| | | | |
|---|---|---|---|
| 8,993,397 B2 | 3/2015 | Herner | |
| 9,147,836 B2 | 9/2015 | Greene et al. | |
| 9,601,546 B1 | 3/2017 | Ando et al. | |
| 10,096,616 B2 | 10/2018 | Lee et al. | |
| 10,916,509 B2 | 2/2021 | Cho et al. | |
| 2016/0093581 A1 | 3/2016 | Jeong et al. | |
| 2021/0193920 A1* | 6/2021 | Ando | H10N 70/826 |

FOREIGN PATENT DOCUMENTS

WO     2015177971 A1     11/2015

OTHER PUBLICATIONS

Adam et al., "3D ReRAM Arrays and Crossbars: Fabrication, Characterization and Applications," Nanotechnology (IEEE-NANO), 2017 IEEE 17th International Conference on, 2017, pp. 844-849.
Electronic Materials Research Laboratory, "Redox-based Tera-bit memories," http://www.emrl.de/r_a_1.html (retrieved Jan. 3, 2018), 10 pages.
Wong et al., "Metal-Oxide RRAM," Proceedings of the IEEE, vol. 100, No. 6, Jun. 2012, pp. 1951-1970.

* cited by examiner

Primary Examiner — Marvin Payen
(74) Attorney, Agent, or Firm — Cantor Colburn LLP; L. Jeffrey Kelly

(57) ABSTRACT

Embodiments of the invention are directed to a structure that includes a resistive switching device (RSD). The RSD includes a first terminal having an outer sidewall surface; a second terminal; an active region having a switchable conduction state; and a first protective layer on the outer sidewall surface of the first terminal.

20 Claims, 14 Drawing Sheets

RESISTIVE SWITCHING DEVICE HAVING A PROTECTIVE ELECTRODE RING

BACKGROUND

The present invention relates in general to resistive switching devices. More specifically, the present invention relates to fabrication methodologies and resulting structures for forming a resistive switching device having a top electrode with a protective electrode ring configured to prevent electrode sidewall damage during the formation of an electrode contact.

Resistive random access memory (RRAM or ReRAM) is a nano-scale non-volatile memory (NVM). RRAM provides simple storage cell components, high density, low power, large endurance, fast write, read and erase speeds, and excellent scalability. A typical RRAM storage cell is two-terminal device formed as a metal-insulator-metal (MIM) structure, which is referred to herein as a resistive switching device (RSD). The insulator material can be a binary metal oxide, which makes the MIM storage cell compatible with silicon-based CMOS (complementary metal oxide semiconductor) fabrication process. When a sufficient electrical signal is applied across the metal electrodes of a MIM, the resistance of the insulator can be switched from one resistance state to another. The insulator retains its resistance state until an appropriate electrical signal is applied across the metal electrodes to change it.

RRAM, along with the logic circuitry used to address, read and write individual RRAM cells, can be implemented in a crossbar array, which is compatible with a variety of electronic circuits and devices, including neuromorphic architectures. A basic crossbar array includes a set of conductive row electrode lines and a set of conductive column electrode lines formed to intersect the set of conductive row electrode lines. The intersections between the two sets of electrode lines are separated by a so-called "cross-point" device, which, in memory circuits, can be implemented as an RSD.

SUMMARY

Embodiments of the invention are directed to a structure that includes a resistive switching device (RSD). The RSD includes a first terminal having an outer sidewall surface; a second terminal; an active region having a switchable conduction state; and a first protective layer on the outer sidewall surface of the first terminal.

Embodiments of the invention are directed to a method of forming a structure that includes an RSD. The RSD includes a first terminal having an outer sidewall surface; a second terminal; an active region having a switchable conduction state; and a first protective layer on the outer sidewall surface of the first terminal.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 5-14 depict cross-sectional views illustrating a crossbar array after fabrication operations for forming a crossbar in accordance with aspects of the invention, in which:

FIG. 5 depicts a cross-sectional view of a crossbar array after a fabrication operation according to aspects of the invention;

FIG. 6 depicts a cross-sectional view of a crossbar array after a fabrication operation according to aspects of the invention;

FIG. 7 depicts a cross-sectional view of a crossbar array after a fabrication operation according to aspects of the invention;

FIG. 8 depicts a cross-sectional view of a crossbar array after a fabrication operation according to aspects of the invention;

FIG. 9 depicts a cross-sectional view of a crossbar array after a fabrication operation according to aspects of the invention;

FIG. 10 depicts a cross-sectional view of a crossbar array after a fabrication operation according to aspects of the invention;

FIG. 11 depicts a cross-sectional view of a crossbar array after a fabrication operation according to aspects of the invention; and FIG. 12 depicts a cross-sectional view of a crossbar array after a fabrication operation according to aspects of the invention;

FIG. 13 depicts a cross-sectional view of a crossbar array after a fabrication operation according to aspects of the invention; and FIG. 14 depicts a cross-sectional view of a crossbar array after a fabrication operation according to aspects of the invention.

DETAILED DESCRIPTION

Figure 1B:
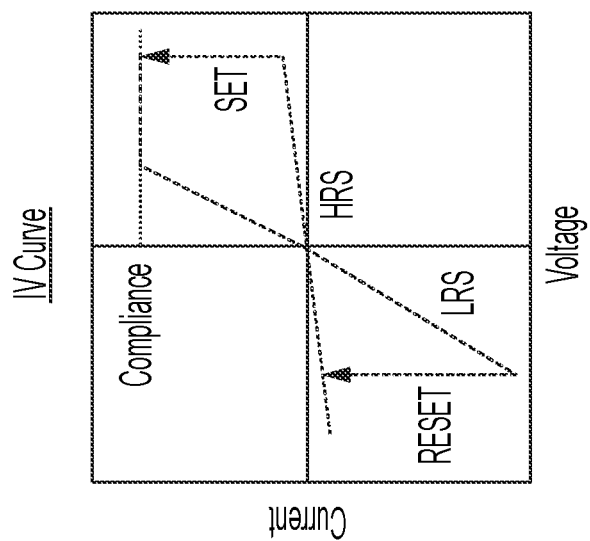
FIG. 1B depicts a diagram of an I-V curve illustrating the switching operation of the RSD component shown in FIG. 1A.

It is understood in advance that, although this description includes a detailed description of the formation and resulting structures for a specific type of RSD, implementation of the teachings recited herein are not limited to a particular type of RSD or IC architecture. Rather embodiments of the present invention are capable of being implemented in conjunction with any other type of RSD (e.g., phase change memory, spin-transfer torque memory, and the like) or IC architecture, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the fabrication of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, with the growth of digital data applications, there is a need for increasingly fast and scalable memory technologies for data storage and data-driven computation. RRAM is a high speed, high density, and low fabrication cost NVM technology. Thus, RRAM has the potential to replace and/or complement the limited scaling of flash memories and other silicon-based memories such as dynamic random access memory (DRAM) and static random access memory (SRAM).

A typical RRAM storage cell is a two-terminal device formed as a metal-insulator-metal (MIM) structure, which is a simpler construction than the three terminal storage cells used in conventional CMOS-based DRAM or flash memory. The insulator material in the MIM can be a binary metal oxide, which makes fabricating a MIM RRAM storage cell compatible with silicon-based CMOS fabrication process. The resistance of an RRAM storage cell serves as the switchable conduction state that stores data. The resistance can be changed by electrical pulses that change the state of the conductive filament (CF) within the binary metal oxide.

Because each RRAM storage cell uses only two external terminals, these memories can be accommodated in a crossbar array, which is compatible with a variety of electronic circuits and devices, including ultra-high density NVM and artificial neural network (ANN) architectures. ANNs can be embodied in so-called "neuromorphic" microchips and architectures. Neuromorphic systems are interconnected processor elements that act as simulated "neurons" and exchange "messages" between each other in the form of electronic signals. Similar to the so-called "plasticity" of synaptic neurotransmitter connections that carry messages between biological neurons, the connections in neuromorphic systems such as ANNs carry electronic messages between simulated neurons, which are provided with numeric weights that correspond to the strength or weakness of a given connection. The weights can be adjusted and tuned based on experience, making neuromorphic systems adaptive to inputs and capable of learning. For example, a neuromorphic/ANN for handwriting recognition is defined by a set of input neurons, which can be activated by the pixels of an input image. After being weighted and transformed by a function determined by the network's designer, the activations of these input neurons are then passed to other downstream neurons, which are often referred to as "hidden" neurons. This process is repeated until an output neuron is activated. The activated output neuron determines which character was read.

A basic crossbar array includes a set of conductive row electrode lines and a set of conductive column electrode lines formed to intersect the set of conductive row electrode lines. The intersections between the two sets of electrode lines are separated by a so-called "cross-point" device, which, in RRAM memory circuits, can be implemented as a two-terminal MIM RSD. The conduction state (e.g., resistance) of the MIM insulator can be altered by controlling the voltages applied between individual electrode lines of the row and column electrode lines. Digital data can be stored by alteration of the insulator material's conduction state at the intersection to achieve a high conduction state (or low resistance state (LRS)) or a low conduction state (or high resistance state (HRS)). The MIM insulator material can also be programmed to maintain two or more distinct conduction states by selectively setting the conduction state of the material. The conduction state of the memristor material can be read by applying a voltage across the material and measuring the current that passes through the target crosspoint device.

Thus, RRAM is a promising technology for neuromorphic computing. More specifically, an RSD storage cell can be used as a connection (synapse) between a pre-neuron and a post-neuron, thus representing the connection weight in the form of device resistance. Multiple pre-neurons and post-neurons can be connected through a crossbar array of RRAMs, which naturally expresses a fully-connected neural network. In order to make a large scale crossbar array, the electrode line resistance needs to be minimized in order to accurately read the voltage drop across the electrode line. Accordingly, the electrode lines of an RRAM crossbar array is typically formed from copper (Cu), and the RRAM MIM stack typically includes TiN electrodes for compatibility with CMOS fabrication processes.

Known RRAM fabrication processes use an additive patterning damascene process to form the Cu electrode lines of the RRAM crossbar array. To protect the topmost RSD electrode during etch operations used to form the Cu electrode lines, a hardmask and sidewall spacers are formed on a top surface and sidewalls of the RSD stack. However, known damascene etches can erode the sidewalls spacers thereby exposing the sidewalls of the topmost RSD electrode to damage resulting from exposure to the damascene etchants.

Turning now to an overview of aspects of the present invention, embodiments of the invention address the shortcomings of the prior art by providing fabrication methodologies and resulting structures for forming an RSD having a top electrode with a protective layer around an outer surface of the top RSD electrode. The protective layer can be formed from a protective layer material that is selected to have an etch selectivity to etchants (i.e., etch substances) used to form the Cu electrode lines that is lower than the etch selectivity of the topmost RSD electrode to the etchants (or etch substances) used to form the Cu electrode lines. In some embodiments of the invention, the protective layer can be applied to the top and bottom RSD electrodes.

Figure 1A:
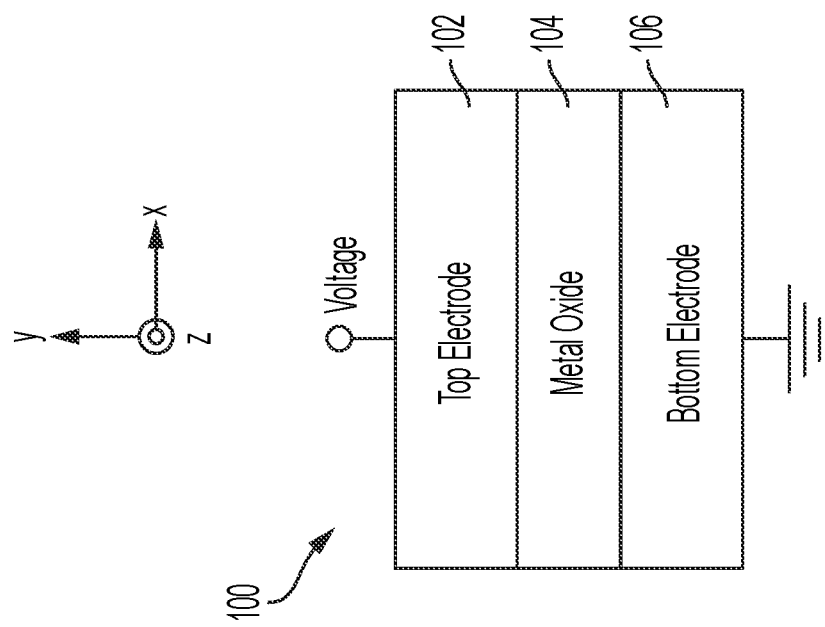
FIG. 1A depicts a simplified block diagram illustrating a cross-sectional view of a two-terminal resistive switching device (RSD), which can be used as a storage cell of an RRAM structure capable of incorporating aspects of the invention.

Turning now to a more detailed description of example embodiments of the invention, FIG. 1A depicts a simplified block diagram illustrating a cross-sectional view of a two-terminal RSD component 100, which can be used as a storage cell of an RRAM structure (e.g., crossbar array 200 shown in FIG. 2) capable of incorporating aspects of the invention. The RSD component or storage cell 100 includes a top electrode 102, metal oxide active region 104, and a bottom electrode 106, configured and arranged as shown. When a sufficient electrical signal (e.g., a voltage) is applied across the top/bottom electrodes 102, 106, the resistance of the metal oxide 104 can be switched from one resistance state to another. The metal oxide 104 retains its current resistance state until an appropriate electrical signal is applied across the top/bottom electrodes 102, 106 to change it.

FIG. 1B depicts a diagram of an I-V curve illustrating the switching operation of the RSD storage cell 100. The operation principle of the RSD storage cell 100 is based on the reversible resistive switching (RS) between at least two stable resistance states, namely the high resistance state (HRS) and low resistance state (LRS), which occur in the metal oxide 104. In general, the operation that changes the resistance of the storage cell 100 from a high resistance state (HRS) to a low resistance state (LRS) is called a SET process, while the opposite process is defined as a RESET process. The specific resistance state (HRS or LRS) can be retained after the electric stress is cancelled, which indicates the nonvolatile nature of RRAM. For an initial operation, a voltage larger than the SET voltage is needed in order to "turn on" the resistive switching behaviors of the metal oxide 104 for the subsequent cycles. This is often referred to as the forming process or the electroforming process.

Based on the electrical polarity's relationship between the SET process and the RESET processes, the resistive switching behaviors of the storage cell 100 can be divided into two modes, which are known as a unipolar mode (not shown) and a bipolar mode (shown in FIG. 1B). In the unipolar switching mode, both SET and RESET transitions are achieved by applying electrical voltages of the same polarity (e.g., a positive voltage). In the bipolar switching mode, SET and RESET transitions are executed by applying voltages of opposite polarities (e.g., a positive voltage SET and a negative voltage RESET). The current is often limited by a compliance level during the abrupt set transition in order to suitably control the size of current conducting filament (CF) and the corresponding LRS resistance value.

Figure 2:
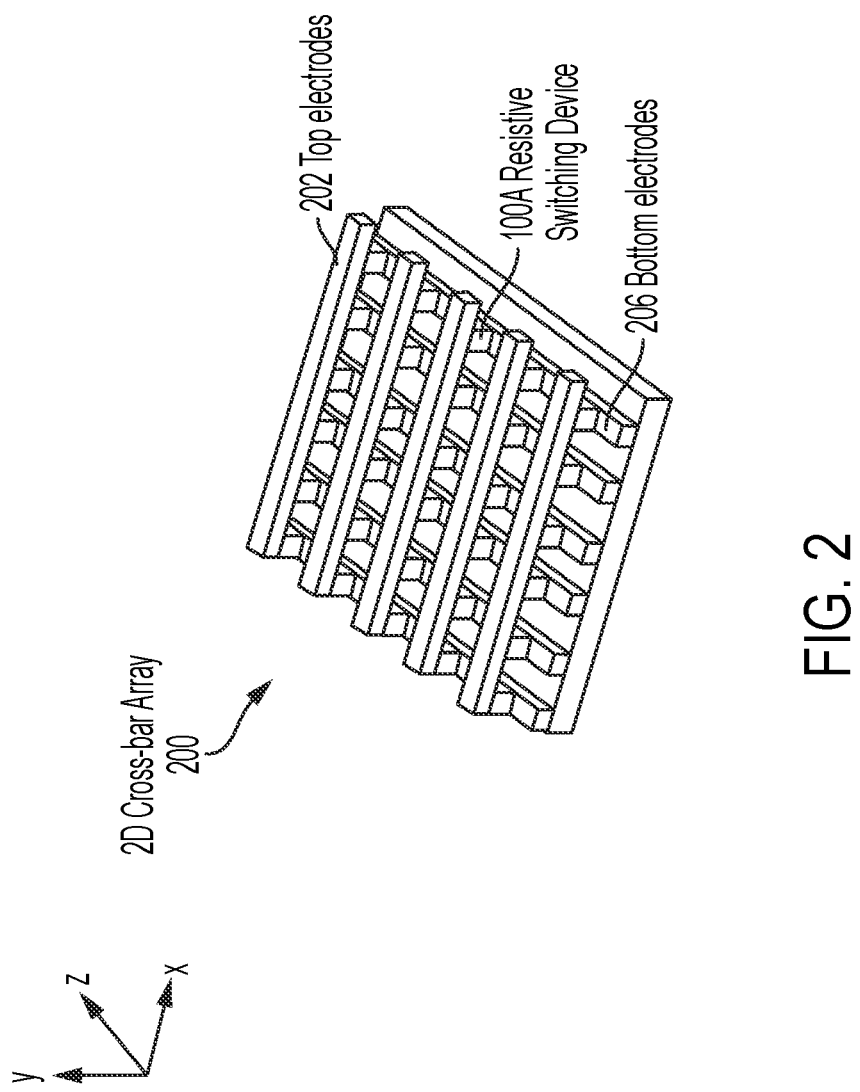
FIG. 2 depicts a simplified block diagram illustrating how the RSD component shown in FIG. 1A can be utilized as an addressable cross-point storage cell of an RRAM crossbar array capable of incorporating aspects of the invention.

FIG. 2 depicts an RRAM crossbar array 200 capable of incorporating aspects of the invention. The array 200 includes perpendicular conductive top electrode lines 202 (e.g., wordline rows), conductive bottom electrode lines 204 (e.g., bitline columns), and RSD memory cells 100A at the intersection between each top electrode line 202 and bottom electrode line 204. In embodiments of the invention, the storage cell 100A can be configured to incorporate a novel protective layer/ring 102B (shown in FIGS. 3A, 3B) in accordance with aspects of the invention. Each storage cell 100A can be accessed for read and write by biasing the corresponding top electrode line 202 and bottom electrode line 204.

Figures 3A, 3B:
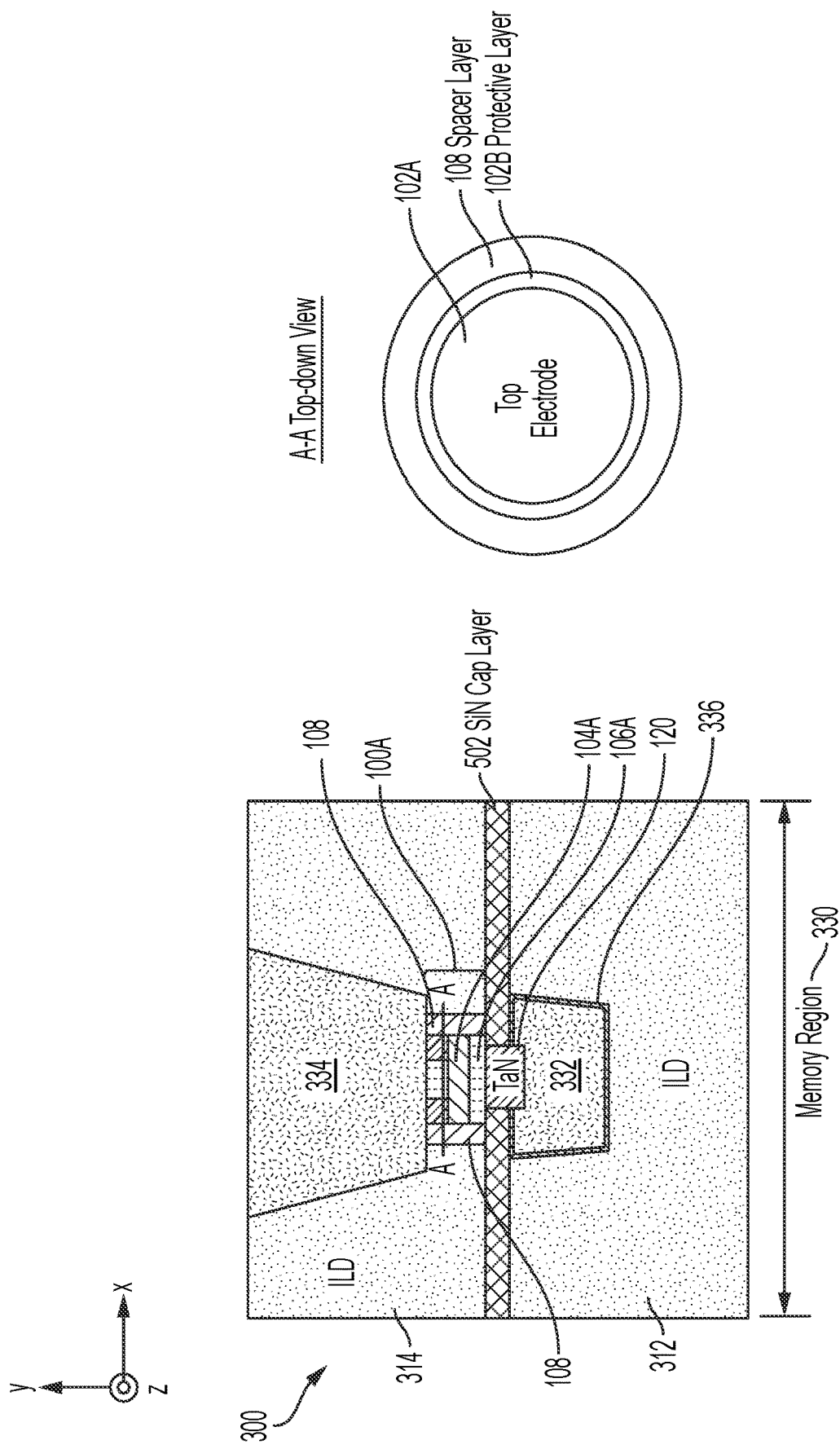
FIG. 3A depicts a cross-sectional view of a portion of a crossbar array incorporating aspects of the invention.
FIG. 3B depicts a cross-sectional top-down view taken along line A-A of FIG. 3A.

FIG. 3A depicts a cross-sectional view showing a simplified diagram of a portion of a crossbar array 300 incorporating aspects of the invention. The crossbar array 300 includes a bottom interlayer dielectric (ILD) 312; a top ILD 314; a dielectric cap layer 502; a set of bottom electrode lines 332; a barrier liner 336 surrounding each of the set of bottom electrode lines 332; a TaN liner (or Cu diffusion barrier) 120; a first set of top electrode lines 334; and an RSD storage cell 100A, configured and arranged as shown. The crossbar array 300 includes a memory or RRAM area 330. In embodiments of the invention, the crossbar array 300 includes circuitry configured to address, read and write RSD memory cells 100A in the RRAM region 330 of the crossbar array 300. The crossbar array 300 is a simplified diagram. For example, the set of bottom electrode lines 332, the RSD storage cell 100A, and the set of top electrode lines 334 represent one example of the multiple top/bottom electrode pairs and crosspoint devices in the RRAM region 330, which corresponds to the crossbar array 200 shown in FIG. 2.

In embodiments of the invention, the RSD storage cell 100A includes a top electrode 102A, a protective layer 102B, a metal oxide (e.g., HfO) active region 104A, a bottom electrode 106A, and a spacer layer 108, configured and arranged as shown. The RSD storage cell 100A operates in substantially the manner as the RSD storage cell 100 depicted in FIG. 1A. When a sufficient electrical signal (e.g., a voltage) is applied across the top/bottom electrodes 102A, 106A, the resistance of the metal oxide 104A can be switched from one resistance state to another. The metal oxide 104A retains its current resistance state until an appropriate electrical signal (e.g., from a logic area of the crossbar array 300) is applied across the top/bottom electrodes 102A, 106A to change it.

Referring now to FIGS. 3A and 3B, the RSD storage cell (or memory cell) 100A addresses the harsh impact of damascene crossbar line fabrication operations by providing the top electrode 102A with the protective layer 102B. As shown by the top-down view shown in FIG. 3B, which is taken along line A-A of FIG. 3A, the RSD 100A can in some embodiments of the invention be in the shape of an elongated round pillar, the top electrode 102A can be in the shape of a circular disc, and the protective layer 102B can be in the shape of a ring that surrounds the top electrode 102A. In some embodiments of the invention, the top-down profile of the RSD 100A can be other shapes, including square, rectangular, triangular, and the like. The top electrode 102A and the protective layer 102B can be formed by fabricating the top electrode 102A to have a first diameter, trimming or etching back an outer surface of the top electrode 102A to a second diameter, and filling in the space formed by the removed portions of the top electrode 102A with the protective layer 102B, thereby bringing the combined top electrode and protective layer 102A, 102B back to the first diameter.

In accordance with aspects of the invention, the protective layer 102B protects the exposed outer walls of the top electrode 102A from being damaged by the various damascene etch operations that are used to form the crossbar array lines 332, 334. As described in greater detail subsequently herein, a damascene etch operation is characterized by depositing a hardmask layer over the ILD 314; depositing a photoresist layer on the hardmask layer; patterning the photoresist layer to define a footprint of the top crossbar array line 332; etching the exposed portions of the hardmask layer to open access to the ILD 314; etching the open surface of the ILD 314 to form a trenches in the ILD 314; removing the photoresist and hardmask layers; and forming the top electrode line 334 in the trench. During fabrication, a hardmask layer 110 (shown in FIG. 8) protects a top surface of the top electrode 102A. In RSD structures formed without benefit of the novel protective layer 102B, the spacer layer 108 has the task of protecting sidewalls of the top electrode 102A. However, the above-described damascene etch operations can attack the top surface of the spacer layer 108, thereby reducing the vertical height of the spacer layer 108 such that, without the benefit of having the protective layer 102B, sidewalls of a non-trimmed version of the top electrode 102A would be exposed and subject to being attacked by the above-described damascene etch operations. This is particularly true when the hardmask layer used to define the footprint of the crossbar electrode line 334 is the same material (e.g., TiN) as the top electrode 102A (e.g., TiN).

In accordance with aspects of the invention, the protective layer 102B is formed from a material having an etch selectivity to one or more of the above-described damascene etch operations that is lower than the etch selectivity of the top electrode 102A. In other words, the top protective layer 102B is formed from a material that etches more slowly in response to the above-described damascene etch operations than the top electrode 102A. In some embodiments of the invention, the protective layer 102B can be formed from TaN and/or Ru, and the top electrode 102A can be formed from TiN. In accordance with aspects of the invention, the protective layer 102B is formed from a material having an etch rate to one or more of the above-described damascene etch operations that is lower than the etch rate of the spacer layer 108. In other words, the top protective layer 102B is formed from a material that etches more slowly in response to the above-described damascene etch operations than the spacer layer 108. In some embodiments of the invention, the protective layer 102B can be formed from TaN and/or Ru, and the spacer layer 108 can be formed from SiN. In some embodiments of the invention, the protective layer 102B can be applied to the bottom electrode 106A using substantially the same fabrication operations used to form the protective layer 102B on the top electrode 102A.

Figure 4:
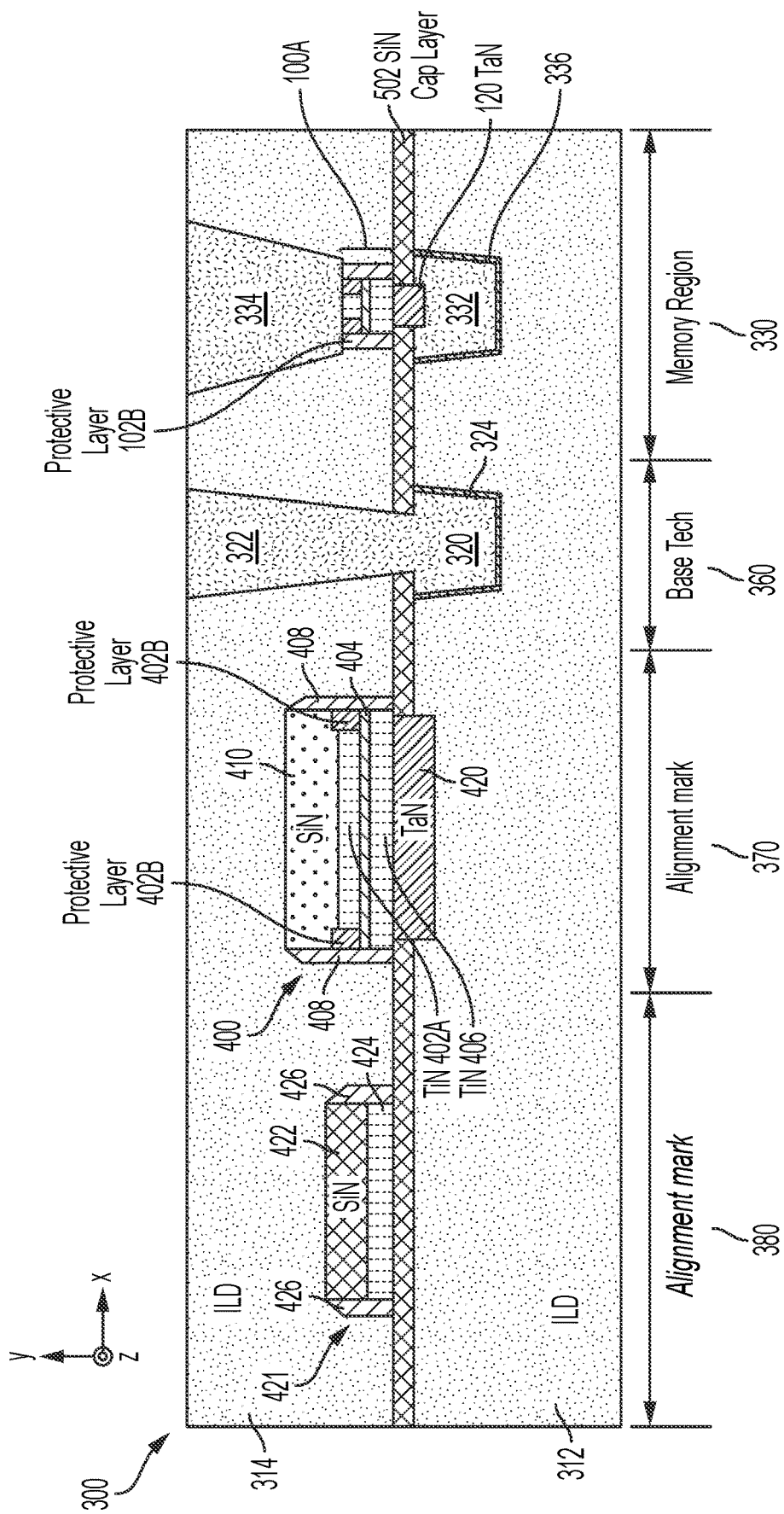
FIG. 4 depicts a cross-sectional view of a portion of a crossbar array incorporating aspects of the invention.

FIG. 4 depicts a cross-sectional view of the crossbar array 300 showing additional regions of the array 300, namely, alignment mark regions 380, 370 and a base technology or logic region 360. Alignment marks are used in the fabrication of integrated circuit (IC) devices because the devices are produced by aligning several layers of conductive, semiconductive, and insulative materials one atop the other with reference to the alignment marks. The alignment regions can be at various depths of the IC, including, for example, a first depth D1 (e.g., depth of ILD 312), a second depth D2 (e.g., depth of ILD 314), and so on. In the alignment mark region 380 a stack 421 is provided. In the alignment mark region 370, an RSD 400 is provided over a TiN liner (or Cu diffusion barrier) 420. The RSD 400 includes a top electrode 402A; a protective layer 402B; a metal oxide (e.g., HfO) active region 404A; a bottom electrode 406A; a SiN hardmask 410 over the top electrode 402A; and a spacer layer 408, configured and arranged as shown. In accordance with aspects of the invention, the RSD 400 can be implemented as a pillar having the same top-down profiles (circular, square, rectangular, and the like) as the RSD 100A. The RSD 400 is used to draw an alignment mark that can be optically detected for a subsequent lithography process.

The base technology/logic area 360 is simplified in that the logic is represented by a first set of bottom electrode lines 320 and the first set of top electrode lines 322, which represent examples of the multiple top/bottom electrode pairs in the logic area 360 that are communicatively connected to transmit signal of the logic circuitry. The base technology or logic region 360 implements logic circuitry that can be configured to utilize the RRAM storage cells 100B. In some embodiments of the invention, the base technology/logic region 360 includes circuitry configured to implement a trainable ANN or other computational neuromorphic circuitry. In some embodiments of the invention, the base technology/logic area 360 includes circuitry configured to address, read and write RSD memory cells 100A in the memory RRAM region 330 of the crossbar array 300.

Figure 5:
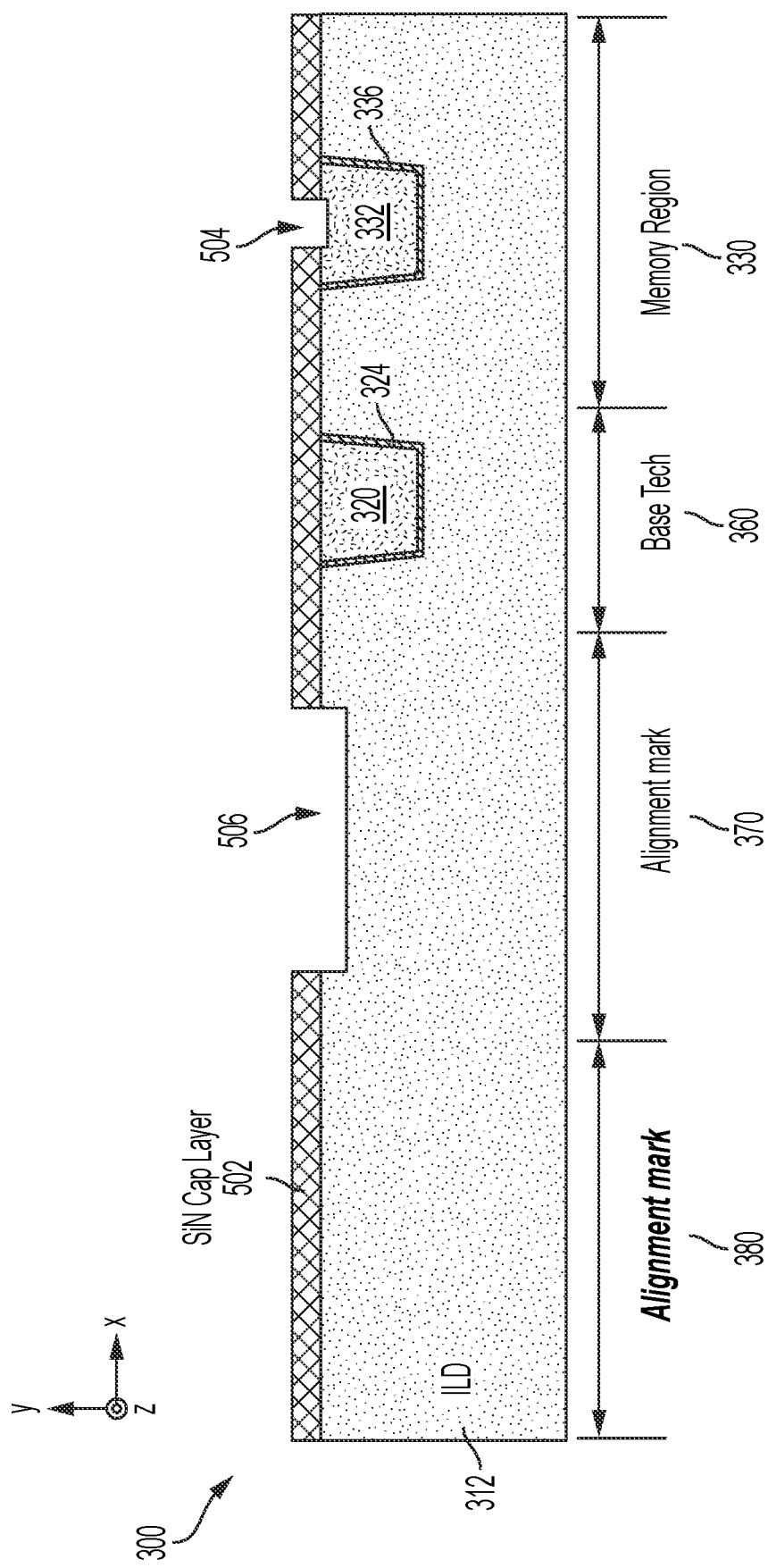

FIGS. 5-14 depict cross-sectional views of the crossbar array 300 after various fabrication operations according to embodiments of the invention. FIG. 5 depicts a cross-sectional view of the crossbar array 300 after an initial set of fabrication operations according to embodiments of the invention. As shown in FIG. 5, conventional semiconductor device fabrication processes (e.g., ALD followed by CMP planarization) have be used to form the bottom ILD 312. In some embodiments of the invention, the ILD 312 can be formed over a substrate (not shown) of an IC (not shown). Known damascene fabrication operations have also been used to form the bottom electrode line 320 and the liner/barrier 324 in the base technology/logic region 360 of the ILD 312, along with forming the bottom electrode line 332 and the liner/barrier 336 in the memory region 330 of the ILD 312. Known fabrication operations (e.g., ALD) have also been used to deposit a cap layer 502 over the ILD 312, and the cap layer 502 is patterned and etched to form a first trench 504 over the bottom electrode line 332, as well as form a second trench 506 in the alignment mark region 370 of the ILD 312.

Figure 6:
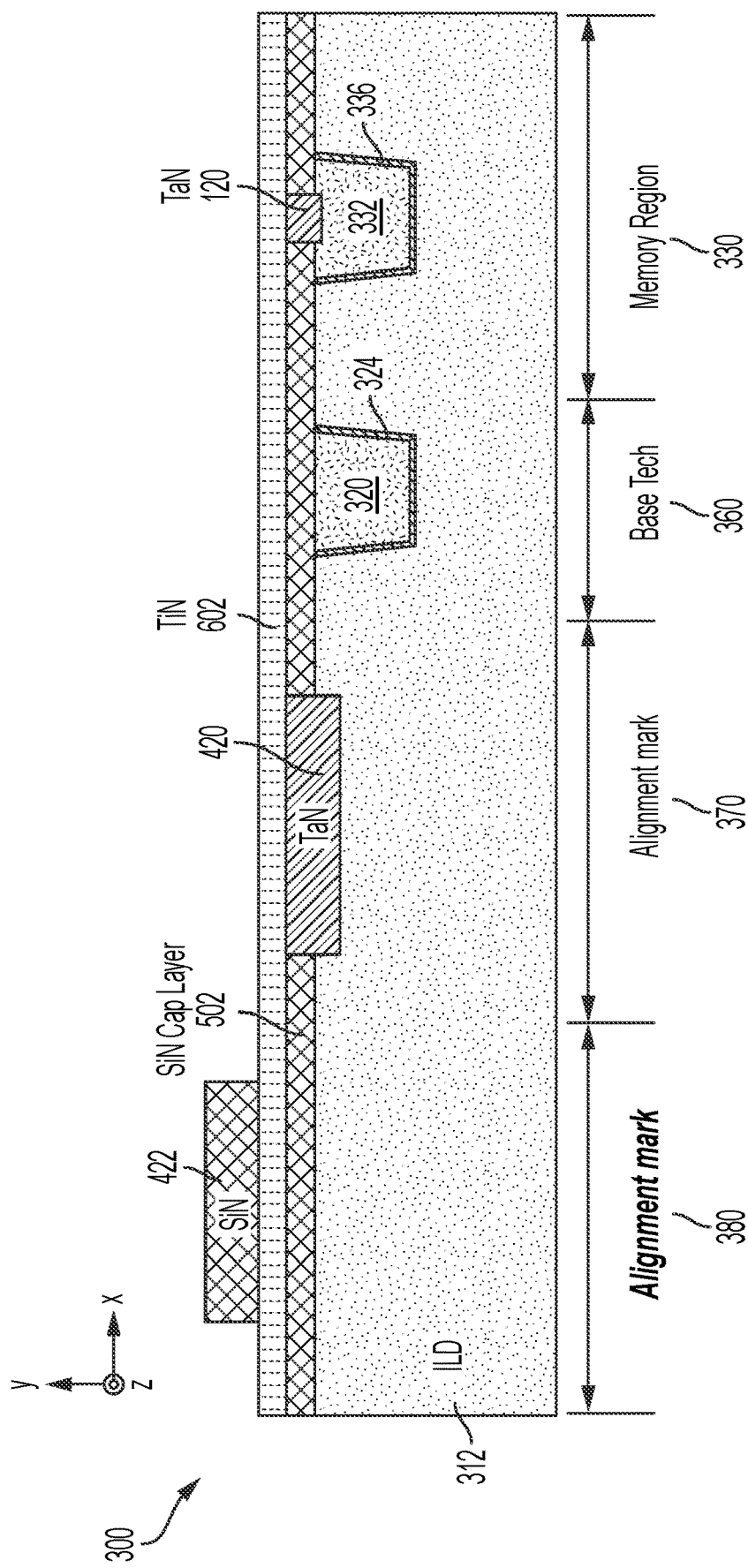

In FIG. 6, known fabrication operations (e.g., ALD) have been used to deposit a TaN liner (not shown) over the cap layer 502, into the first trench 504, and into the second trench 506. A planarization operation (e.g., CMP) is then applied to remove the TaN liner from over the cap layer 502, thereby forming the TaN liner/region 420 in the second trench 506 of the alignment mark region 370 and forming the TaN liner/region 120 in the first trench 504 of the memory region 330. Known fabrication operations (e.g., ALD) are used to deposit a TiN layer 602 over the cap layer 502, the TaN liner/region 420, and the TaN liner/region 120. Known fabrication operations (e.g., ALD) are then used to deposit a SiN layer (not shown) over the TiN layer 602. The SiN layer is patterned and etched to form a SiN region 422 in the alignment region 380.

Figure 7:
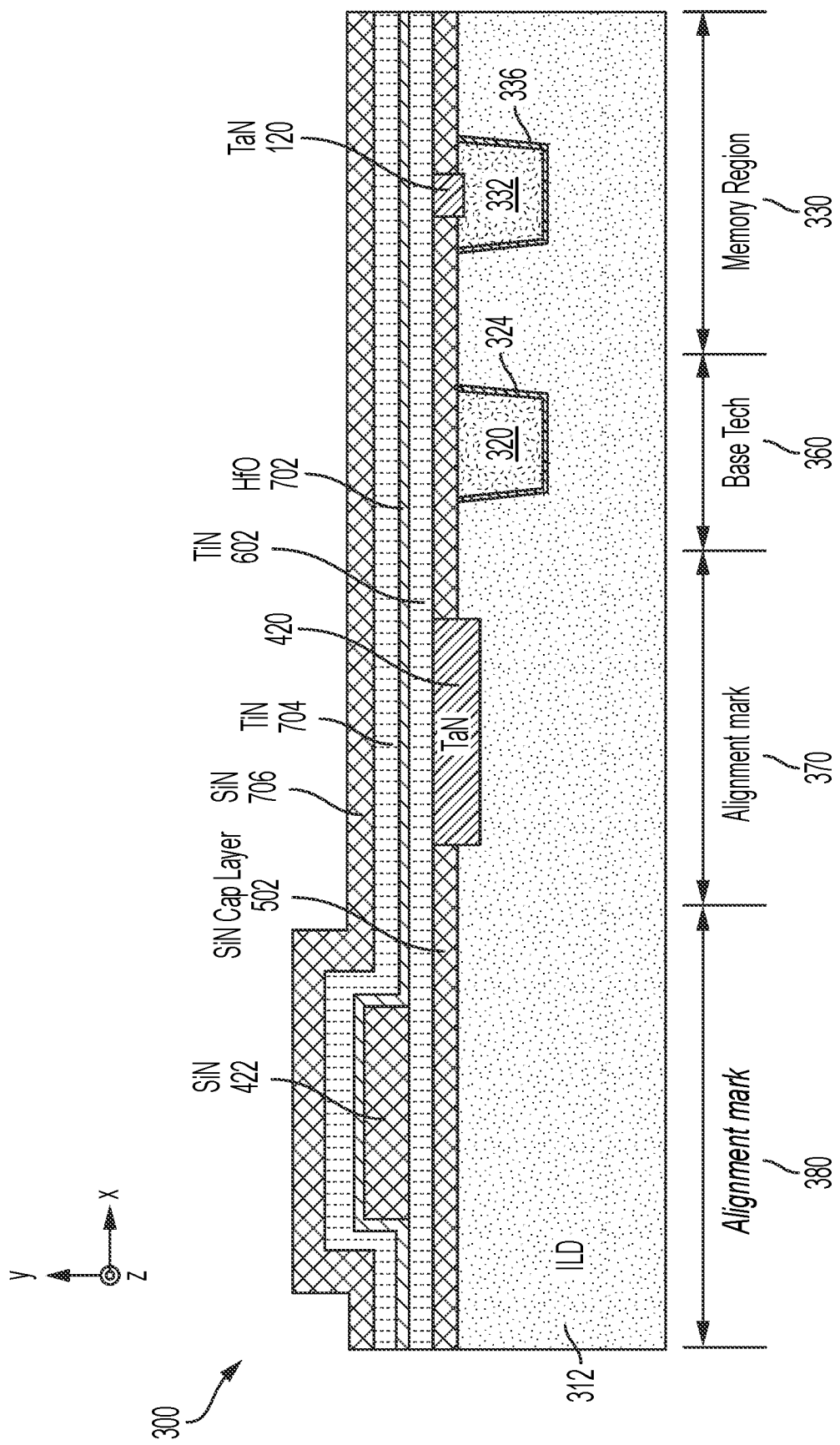

In FIG. 7, known fabrication operations (e.g., ALD) have been used to deposit a HfO layer 702, a TiN layer 704, and a SiN layer 706. The TiN layer 704, the HfO layer 702, and the TiN layer 602 will be used to form the RSD stack of the RSDS 400, 100A shown in FIGS. 3A, 3B, and 4.

Figure 8:
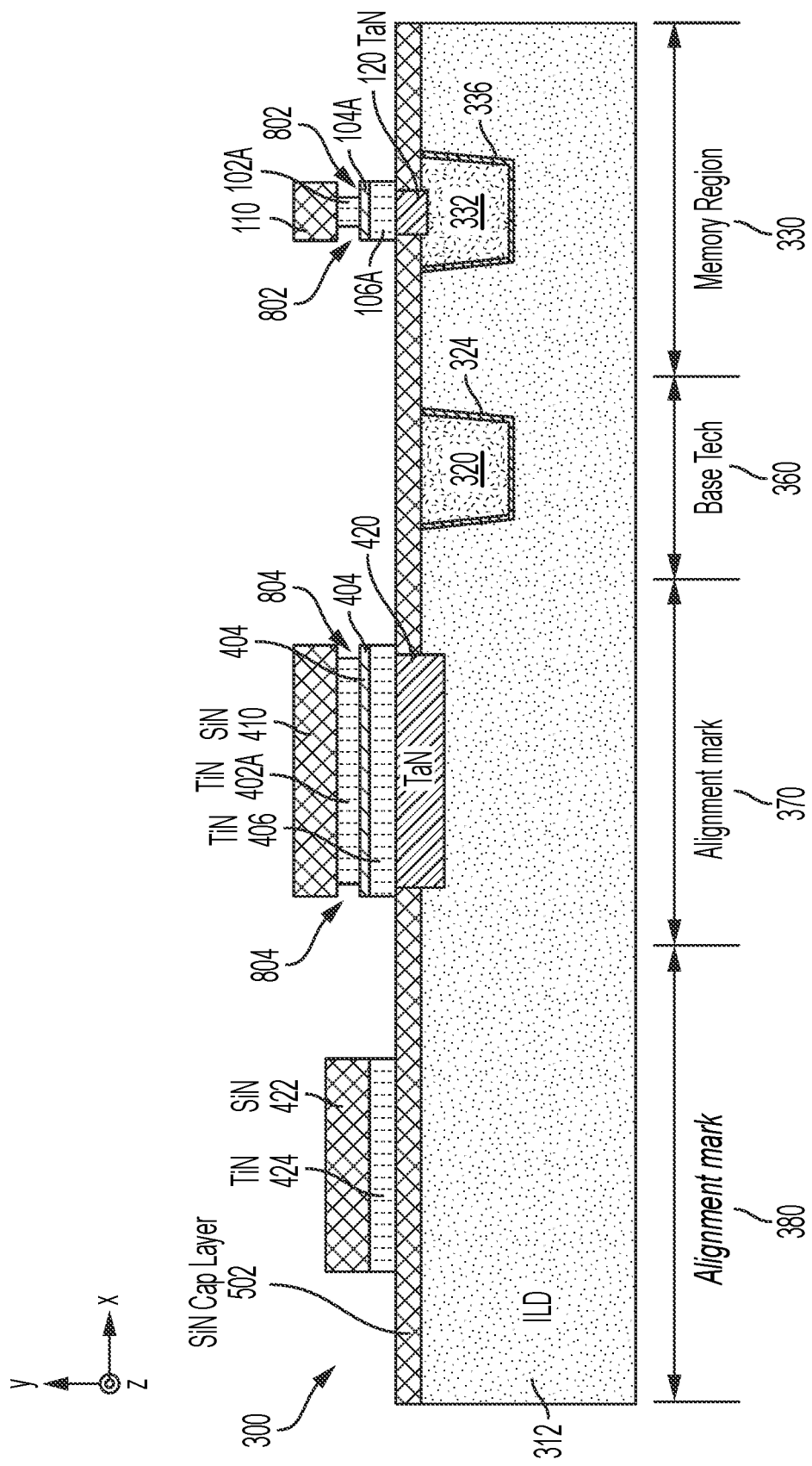

In FIG. 8, known fabrication operations have been used to pattern and etch the layers above the cap layer 502 to form a first stack including a SiN region 422 and a TiN region 424 in the alignment region 380; a second stack including a SiN hardmask 410, an undercut TiN top electrode 402A, a HfO metal oxide region 404, and a TiN bottom electrode 406 in the alignment region 370; and a third stack including a SiN hardmask 110, an undercut TiN top electrode 102A, a HfO metal oxide 104A, and a TiN bottom electrode 106A in the memory region 330. In accordance with aspects of the invention, known fabrication operations have been used to etch back the top electrode 402A to form undercut regions 804. In accordance with aspects of the invention, known fabrication operations have been used to etch back the top electrode 102A to form undercut regions 802.

Figure 9:
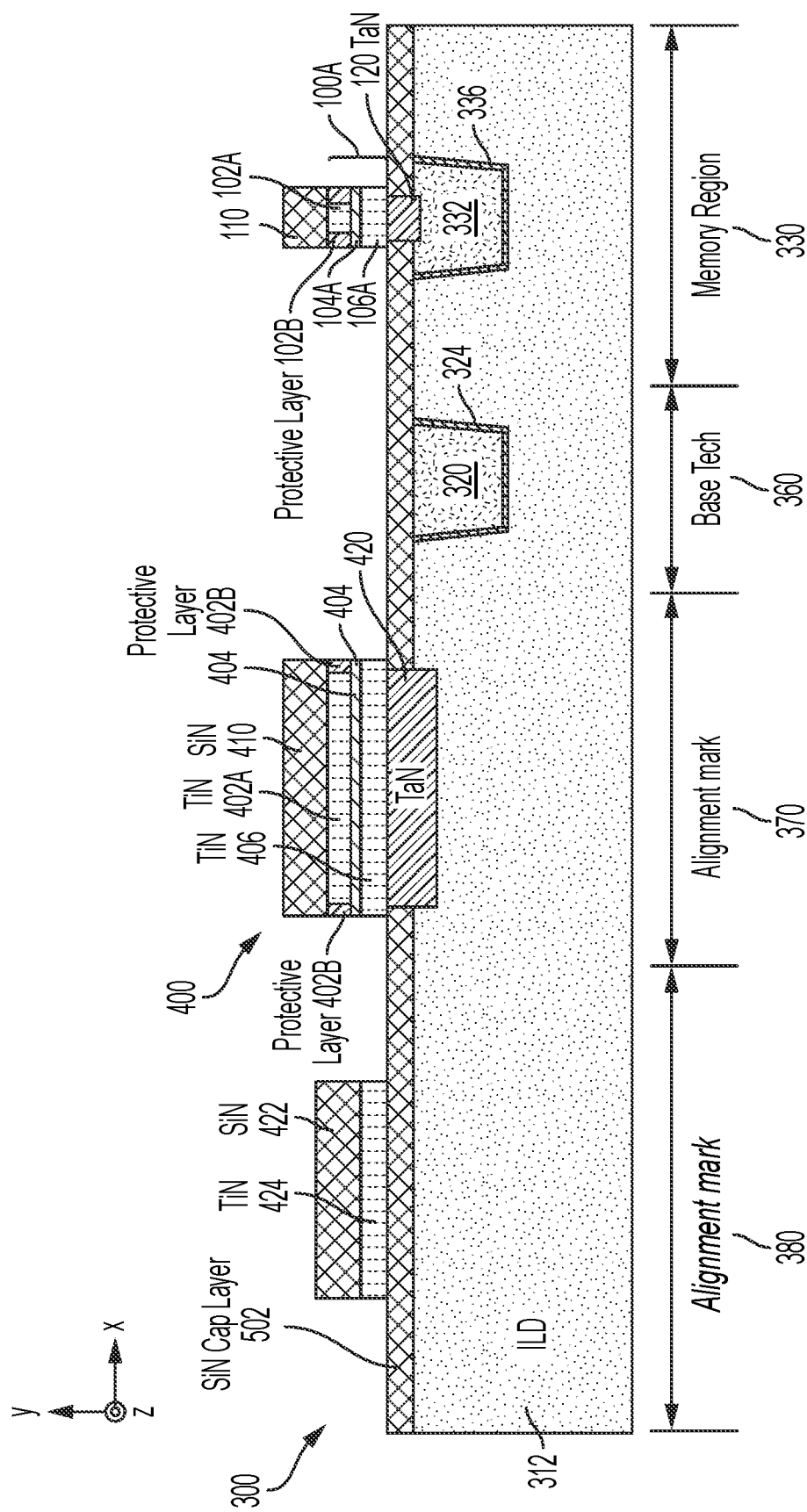

In FIG. 9, known semiconductor fabrication operations (e.g., ALD) have been used to conformally deposit a layer of protective layer material (not shown) over the crossbar array 300. The protective layer can be a material having a lower etch rate to the fabrication operations used to form the top electrode line 334 (shown in FIGS. 3A, 4), including, for example TaN and/or Ru. Additionally, known semiconductor fabrication have been used to form the protective layers 402B, 102B by applying an isotropic etch back on the protective layer material to remove excess protective material on exposed vertical and horizontal surfaces of the crossbar array structure 300, thus leaving the portions of the protective layer material that pinched off in the undercut regions 802, 804 (shown in FIG. 8), thereby forming the protective layers 402B, 102B.

Figure 10:
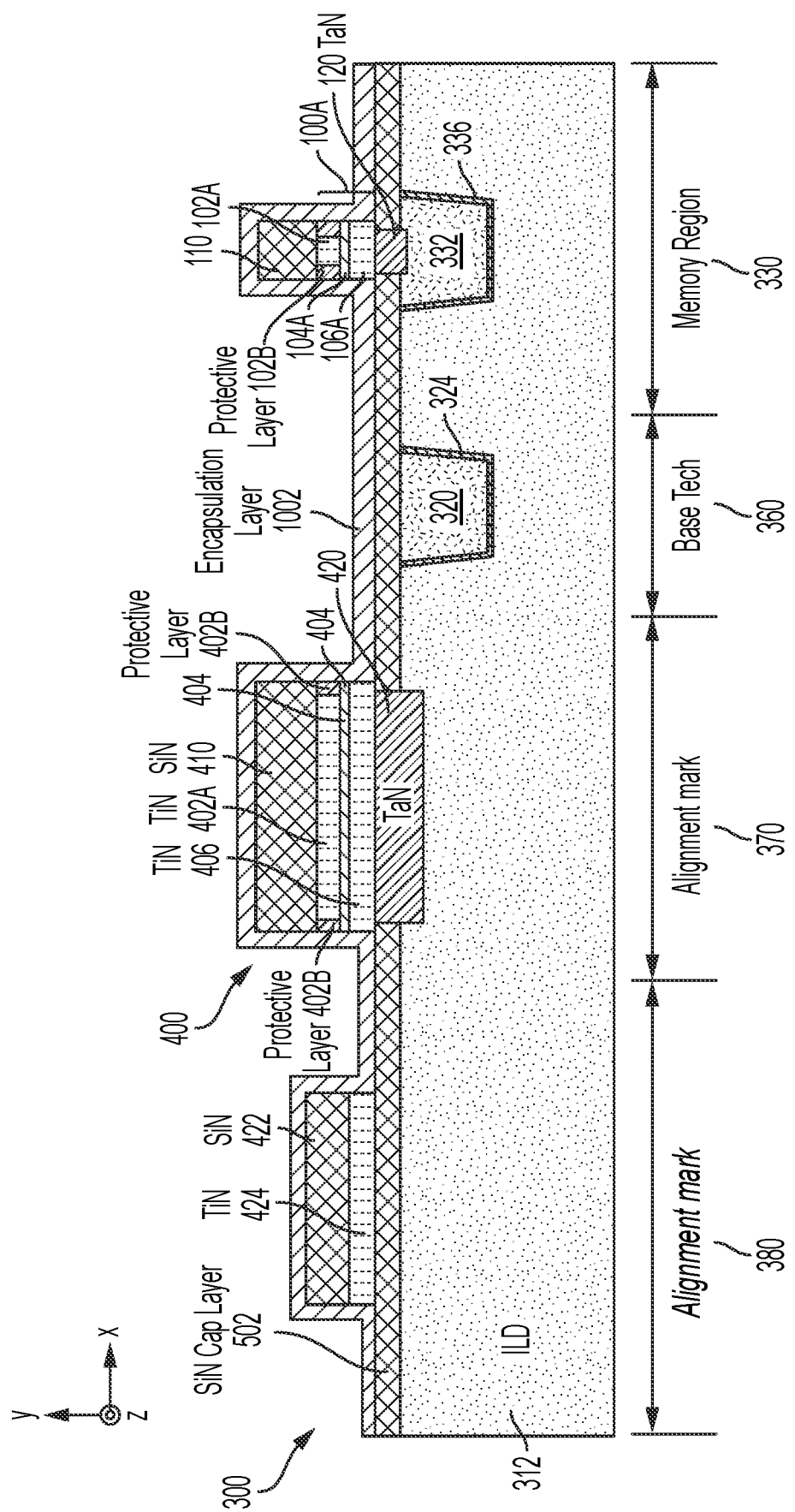

In FIG. 10, known semiconductor fabrication operations (e.g., ALD) have been used to deposit an encapsulation layer 1002 over the crossbar array 300 formed in FIG. 9.

Figure 11:
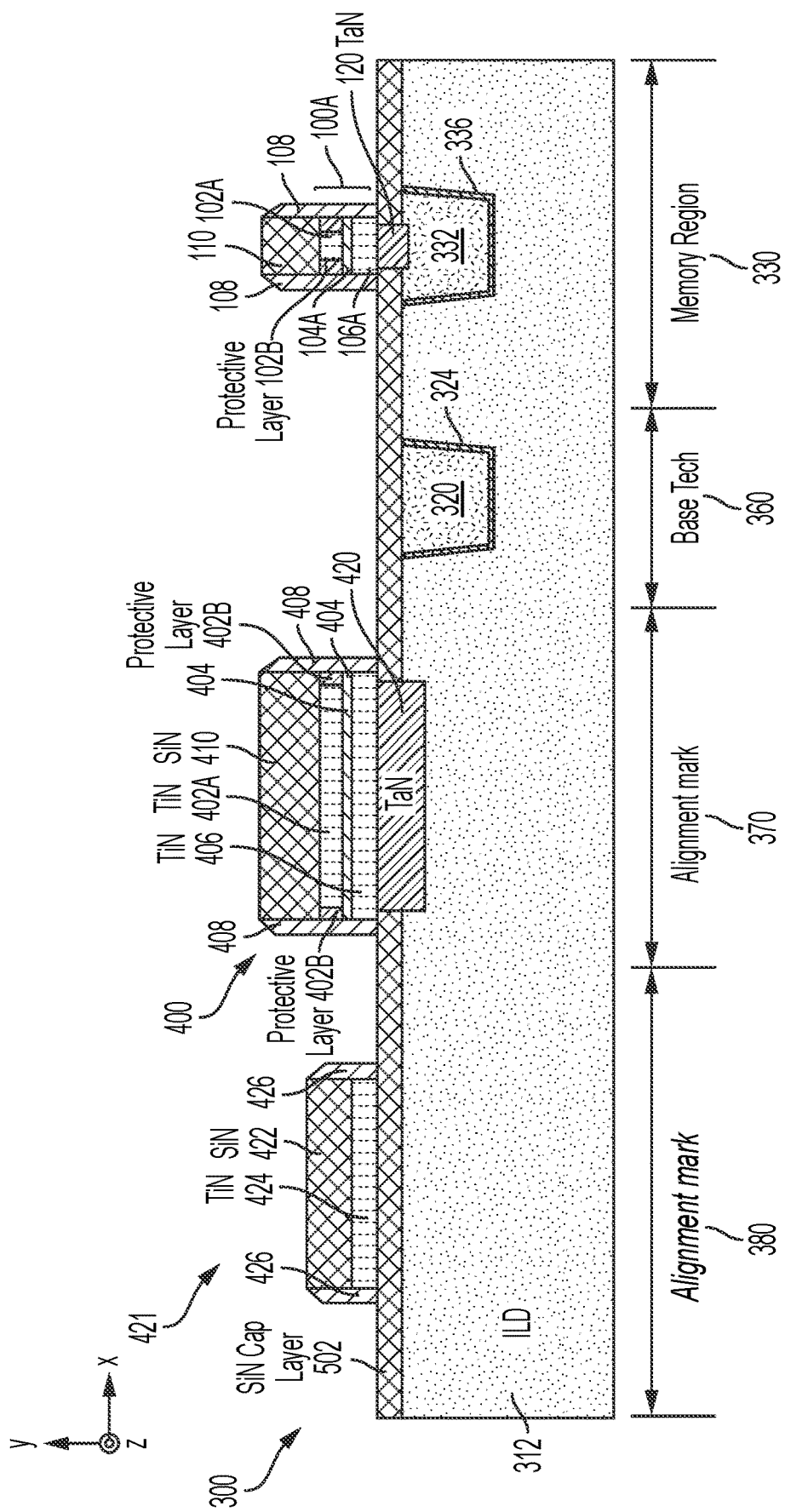

In FIG. 11, known semiconductor fabrication operations (e.g., RIE) have been used to directionally etch the encapsulation layer 1002 (shown in FIG. 10) to form the spacer layer 426 of the stack 421; the spacer layer 408 of the RSD 400; and the spacer layer 108 of the RSD 100A.

Figure 12:
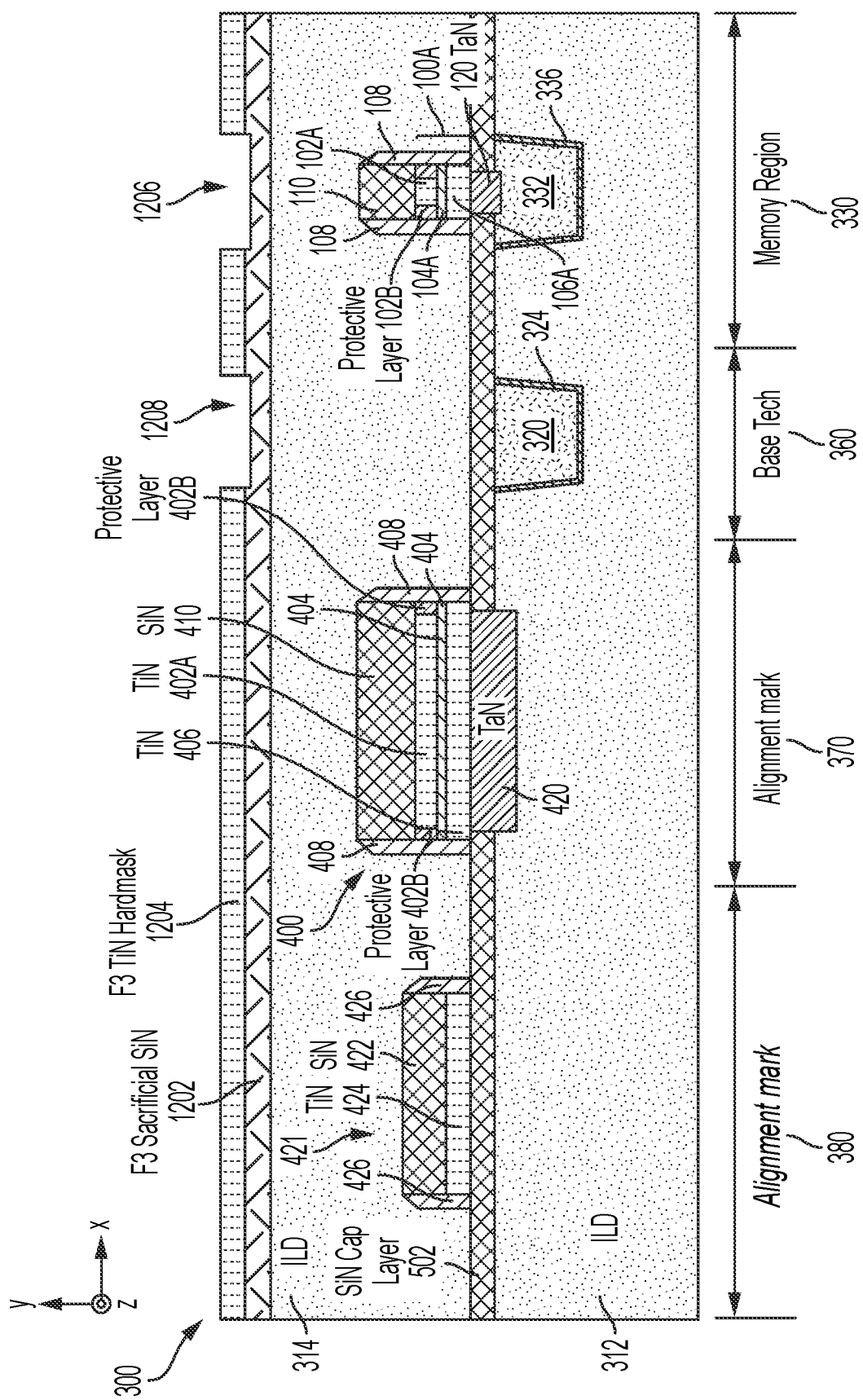

In FIG. 12, known semiconductor device fabrication operations (e.g., ALD followed by CMP planarization) have be used to form the top ILD 314. Known fabrication operations (e.g., ALD) have been used to deposit a sacrificial SiN layer 1202 and a TiN hardmask layer 1204, then pattern and etch the layers 1202, 1204 to form a trench 1206 and a trench 1208.

Figure 13:
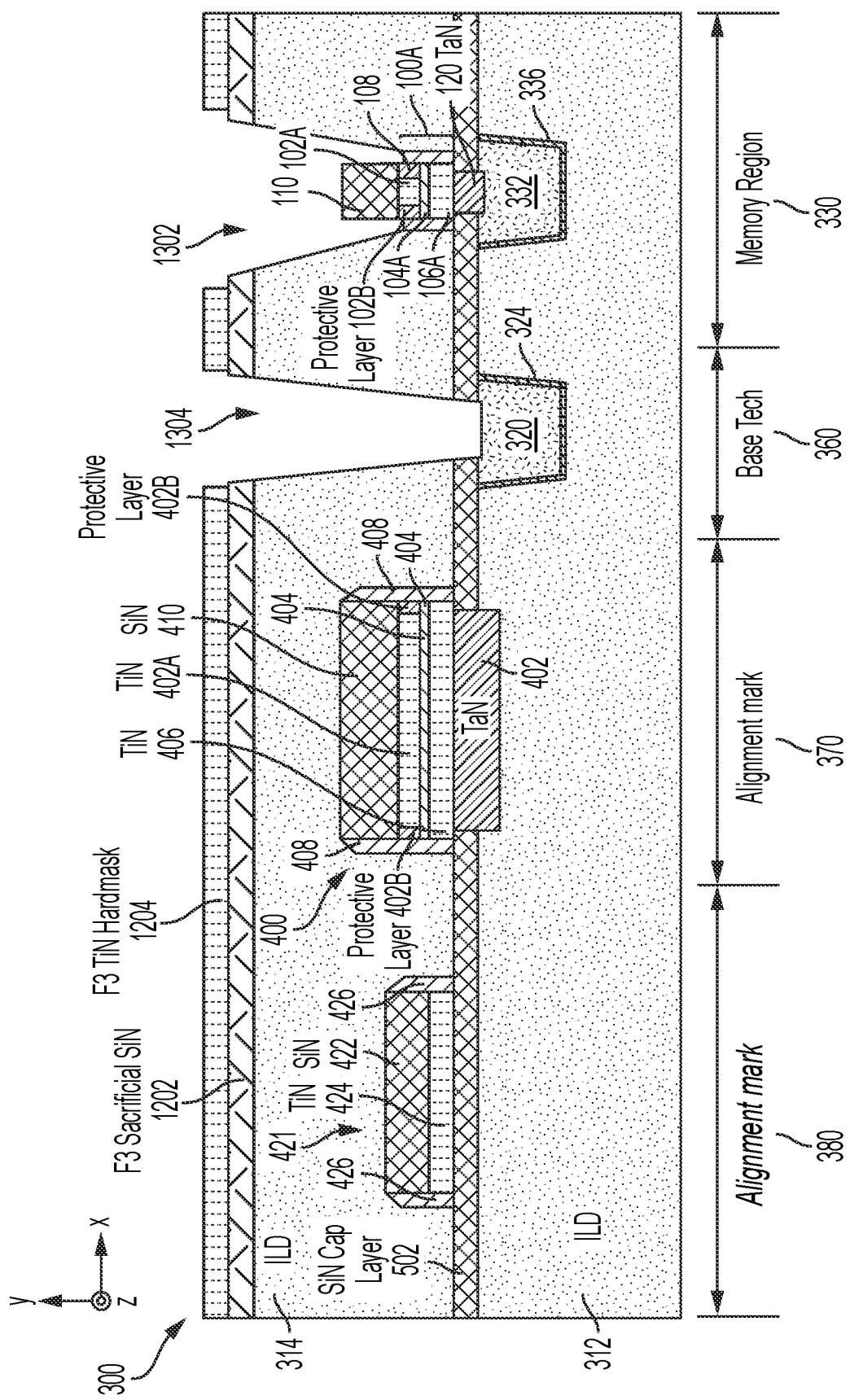

In FIG. 13, known fabrication operations (e.g., RIE) has been used to form the trenches 1303, 1304, thus exposing a top surface of the bottom electrode line 320 and exposing the hardmask 110. The operations used to form the trench 1302 also recess the spacers 108 to the level shown in FIG. 13. After the trenches 1302, 1304 have been formed, the sacrificial SiN layer 1202 and the TiN hardmask layer 1204 are removed. In accordance with aspects of the invention, the various etch operations described above (e.g., etching the spacer 108 and removing the TiN layer 1204) could, without benefit of the protective layer 102B, attack and erode the TIN top electrode 102A. However, the presence of the protective layer 102B protects the TIN top electrode 102A from damage.

Figure 14:
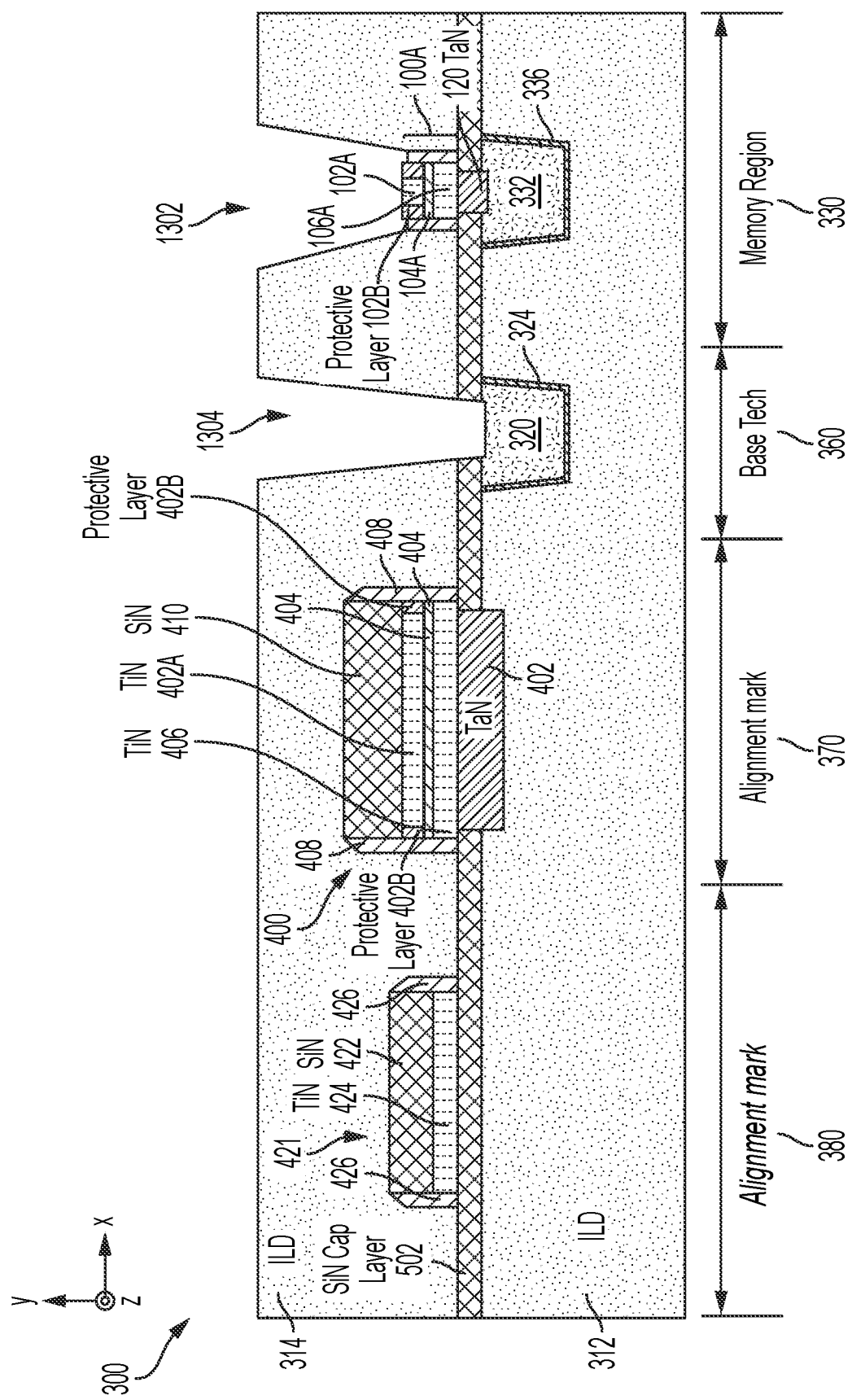

In FIG. 14, known fabrication operations have been used to remove the hardmask 110 from the trench 1302. Known metal fabrication operations are used to form the structure shown in FIG. 4 by forming the top electrode line 322 in the trench 1304, and by forming the top electrode line 334 in the trench 1302. In accordance with aspects of the invention, the lines 332, 334 are each formed by coating the trenches 1302, 1304 with a refractory metal liner/barrier (not shown) such as Ta and TaN$_x$ followed by a thin sputtered metal (e.g., copper) seed layer (not shown separately). The seed layer allows for the electrochemical deposition (ECD) of a thick metal layer that fills up the line trenches 1302, 1304. Excessive metal is removed and the top surface of the crossbar array 300 is planarized by a planarization process such as CMP, thereby forming the top electrode lines 322, 334 shown in FIG. 4.

The crossbar array 300 (shown in FIG. 3A) can be fabricated in the back end of line (BEOL) at relatively low temperatures, which allows for easy integration with CMOS devices. Accordingly, the crossbar array 300 can be used not only for NVM, but also for computing memories, thereby allowing fast data access to overcome the bottlenecks that can occur in conventional von Neumann computing architectures, as well as for computing architectures blurring the distinction between memory circuits and computing circuits, such as nonvolatile memristive logic computation or neuromorphic networks (e.g., ANNs).

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of +8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A structure comprising:
   a resistive switching device (RSD) comprising:
      a first terminal having an outer sidewall surface;
      a second terminal;
      an active region having a switchable conduction state;
      an undercut region at least partially defined by the outer sidewall surface and a portion of a top surface of the active region; and
      a first protective layer within the undercut region.

2. The structure of claim 1, wherein the first protective layer is on the outer sidewall surface of the first terminal.

3. The structure of claim 2, further comprising a first via trench formed above the first terminal, wherein the first terminal comprises a first terminal material having a first etch rate to an etching substance used to form the first via trench.

4. The structure of claim 3, wherein the first protective layer comprises a first protective layer material having a second etch rate to the etching substance used to form the first via trench.

5. The structure of claim 4, wherein the first etch rate of the first terminal material is greater than the second etch rate of the first protective layer material.

6. The structure of claim 5 further comprising a spacer layer on at least a portion of outer sidewalls of the first protective layer.

7. The structure of claim 6, wherein the spacer layer comprises a spacer layer material having a third etch rate to the etching substance used to form the first via trench.

8. The structure of claim 7, wherein the third etch rate of the spacer layer material is greater than the second etch rate of the first protective layer material.

9. The structure of claim 5 further comprising:
a second protective layer formed on outer sidewalls of the second terminal,
wherein the second terminal comprises a second terminal material having a first etch rate to an etching substance used to form the first via trench; and
wherein the second protective layer comprises a second protective layer material having a second etch rate to the etching substance used to form the first via trench.

10. The structure of claim 9, wherein the first etch rate of the second terminal material is greater than the second etch rate of the second protective layer material.

11. A method of forming a structure, the method comprising:
forming a resistive switching device (RSD) comprising:
a first terminal;
a first terminal undercut region at least partially defined by an outer sidewall surface of the first terminal;
a second terminal;
an active region having a switchable conduction state; and
a first protective layer within the first terminal undercut region.

12. The method of claim 11, wherein the first protective layer is on the outer sidewall surface of the first terminal.

13. The method of claim 12 further comprising forming a first via trench above the first terminal, wherein the first terminal comprises a first terminal material having a first etch rate to an etching substance used to form the first via trench.

14. The method of claim 13, wherein the first protective layer comprises a first protective layer material having a second etch rate to the etching substance used to form the first via trench.

15. The method of claim 14, wherein the first etch rate of the first terminal material is greater than the second etch rate of the first protective layer material.

16. The method of claim 15 further comprising forming a spacer layer on at least a portion of outer sidewalls of the first protective layer.

17. The method of claim 16, wherein the spacer layer comprises a spacer layer material having a third etch rate to the etching substance used to form the first via trench.

18. The method of claim 17, wherein the third etch rate of the spacer layer material is greater than the second etch rate of the first protective layer material.

19. The method of claim 15 further comprising:
forming a second protective layer on outer sidewalls of the second terminal,
wherein the second terminal comprises a second terminal material having a first etch rate to an etching substance used to form the first via trench; and
wherein the second protective layer comprises a second protective layer material having a second etch rate to the etching substance used to form the first via trench.

20. The method of claim 19, wherein the first etch rate of the second terminal material is greater than the second etch rate of the second protective layer material.

* * * * *